United States Patent
Guo

(10) Patent No.: US 9,012,327 B2
(45) Date of Patent: Apr. 21, 2015

(54) LOW DEFECT CHEMICAL MECHANICAL POLISHING COMPOSITION

(71) Applicant: Rohm and Haas Electronic Materials CMP Holdings, Inc., Newark, DE (US)

(72) Inventor: Yi Guo, Newark, DE (US)

(73) Assignee: Rohm and Haas Electronic Materials CMP Holdings, Inc., Newark, DE (US)

( * ) Notice: Subject to any disclaimer, the term of this patent is extended or adjusted under 35 U.S.C. 154(b) by 50 days.

(21) Appl. No.: 14/030,126

(22) Filed: Sep. 18, 2013

(65) Prior Publication Data

US 2015/0079788 A1 Mar. 19, 2015

(51) Int. Cl.
*H01L 21/302* (2006.01)
*C09G 1/02* (2006.01)
*H01L 21/306* (2006.01)

(52) U.S. Cl.
CPC .............. *C09G 1/02* (2013.01); *H01L 21/30625* (2013.01)

(58) Field of Classification Search
CPC ................ C09G 1/02; H01L 21/30625; H01L 21/31053
USPC .............. 216/88, 89; 438/692, 693; 252/79.1; 51/307
See application file for complete search history.

(56) References Cited

U.S. PATENT DOCUMENTS

| | | |
|---|---|---|
| 5,738,800 A | 4/1998 | Hosali et al. |
| 6,685,757 B2 | 2/2004 | Xu et al. |
| 6,803,353 B2 | 10/2004 | Martyak et al. |
| 7,097,541 B2 | 8/2006 | DeRege Thesauro et al. |
| 8,431,490 B2 | 4/2013 | Guo et al. |
| 2005/0108949 A1 | 5/2005 | Matsuda et al. |
| 2006/0030158 A1* | 2/2006 | Carter et al. ................. 438/692 |
| 2006/0075688 A1* | 4/2006 | Takenouchi .................... 51/307 |
| 2006/0205218 A1 | 9/2006 | Mueller |
| 2007/0068086 A1* | 3/2007 | Akatsuka ........................ 51/307 |
| 2009/0078908 A1* | 3/2009 | Saie et al. ..................... 252/79.1 |
| 2009/0202816 A1 | 8/2009 | Schlenoff |
| 2009/0311864 A1 | 12/2009 | Yamada et al. |
| 2013/0130596 A1* | 5/2013 | Matsui et al. ................... 451/41 |

OTHER PUBLICATIONS

Sacanna, et al., Shape-anisotropic colloids: Building blocks for complex assemblies, Current Opinion in Colloid & Interface Science, vol. 16, pp. 96-105 (Elsevier 2011).

* cited by examiner

*Primary Examiner* — Shamim Ahmed
(74) *Attorney, Agent, or Firm* — Thomas S. Deibert

(57) ABSTRACT

A low defect chemical mechanical polishing composition for polishing silicon oxide containing substrates is provided comprising, as initial components: water, a colloidal silica abrasive; and, an additive according to formula I.

9 Claims, No Drawings

LOW DEFECT CHEMICAL MECHANICAL POLISHING COMPOSITION

The present invention relates to the field of chemical mechanical polishing. In particular, the present invention is directed to a low defect chemical mechanical polishing composition containing, as initial components: water, a colloidal silica abrasive; and, an additive according to formula I.

In the fabrication of integrated circuits and other electronic devices, multiple layers of conducting, semiconducting and dielectric materials are deposited on or removed from a surface of a semiconductor wafer. Thin layers of conducting, semiconducting, and dielectric materials may be deposited by a number of deposition techniques. Common deposition techniques in modern processing include physical vapor deposition (PVD), also known as sputtering, chemical vapor deposition (CVD), plasma-enhanced chemical vapor deposition (PECVD), and electrochemical plating (ECP).

As layers of materials are sequentially deposited and removed, the uppermost surface of the wafer becomes nonplanar. Because subsequent semiconductor processing (e.g., metallization) requires the wafer to have a flat surface, the wafer needs to be planarized. Planarization is useful in removing undesired surface topography and surface defects, such as rough surfaces, agglomerated materials, crystal lattice damage, scratches, and contaminated layers or materials.

Chemical mechanical planarization, or chemical mechanical polishing (CMP), is a common technique used to planarize substrates, such as semiconductor wafers. In conventional CMP, a wafer is mounted on a carrier assembly and positioned in contact with a polishing pad in a CMP apparatus. The carrier assembly provides a controllable pressure to the wafer, pressing it against the polishing pad. The pad is moved (e.g., rotated) relative to the wafer by an external driving force. Simultaneously therewith, a polishing composition ("slurry") or other polishing solution is provided between the wafer and the polishing pad. Thus, the wafer surface is polished and made planar by the chemical and mechanical action of the pad surface and slurry.

Chemical mechanical planarization is commonly used on shallow trench isolation (STI) layers and on inter-layer dielectric (ILD) or inter-metal dielectric (IMD) layers in the fabrication of semiconductor devices. These dielectric layers act as electrical isolation layers between adjacent semiconductors and conducting pathways. The deposited dielectric material is often referred to as a shallow trench isolation structure or an interlayer dielectric insulator in the semiconductor device. In forming these structures, a problem exists regarding the polishing of the dielectric materials (e.g., silicon oxide) to a suitable planarity quickly without the creation of defects (e.g., scratches). As the size of structures on semiconductor devices continue to shrink, what performance criteria was once acceptable for planarizing and defectivity of polishing dielectric materials becomes increasing less acceptable. Scratches which were once considered acceptable, are now yield limiting.

One polishing formulation for use in a chemical mechanical planarization process that provides a planarization composition with assertedly improved defectivity for dielectric layer polishing is disclosed in U.S. Pat. No. 6,322,600 (Brewer et al.). Brewer et al. disclose a planarization composition having a pH from 9 to 11.5, comprising an alkosol comprising: spherical, monodisperse alkylsilicate particles, in that at least 90 wt % of the particles have a diameter which are no more than 20% different from the weight average diameter, and a liquid carrier comprising: an alcohol, in the range of 0 to 9 wt %, a base and the remainder, water.

Notwithstanding, to support the dynamic field of device designs for use in the manufacture of semiconductor systems there exists a continued need for chemical mechanical polishing compositions formulated to provide a desirable balance of polishing properties to suit changing design needs. For example, there remains a need for chemical mechanical polishing compositions that exhibit a low defectivity dielectric polishing performance and a tailored silicon oxide removal rate.

The present invention provides a chemical mechanical polishing composition, comprising, as initial components: water, 0.1 to 40 wt % of a colloidal silica abrasive; 0.001 to 5 wt % of an additive according to formula I:

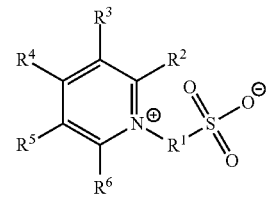

I wherein $R^1$ is a $C_{1-8}$ alkyl group; wherein $R^2$, $R^3$, $R^4$, $R^5$, $R^6$ are each independently selected from a hydrogen, a halogen, a hydroxyl group and a $C_{1-8}$ alkyl group; wherein the chemical mechanical polishing composition contains <0.00000000001 wt % of an inclusion compound; and, wherein the chemical mechanical polishing composition contains <0.00000000001 wt % of an oxidizer.

The present invention provides a chemical mechanical polishing composition, comprising, as initial components: water, 0.1 to 40 wt % of a colloidal silica abrasive; 0.001 to 5 wt % of an additive according to formula I:

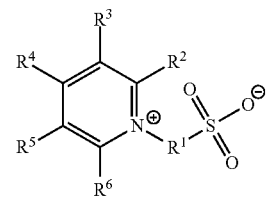

I wherein $R^1$ is a $C_{1-8}$ alkyl group; wherein $R^2$, $R^3$, $R^4$, $R^5$, $R^6$ are each independently selected from a hydrogen, a halogen, a hydroxyl group and a $C_{1-8}$ alkyl group; wherein the chemical mechanical polishing composition contains <0.00000000001 wt % of an inclusion compound; and, wherein the chemical mechanical polishing composition contains <0.00000000001 wt % of an oxidizer; and, wherein the chemical mechanical polishing composition exhibits a pH of ≥10.

The present invention provides a chemical mechanical polishing composition, comprising, as initial components: water, 0.1 to 40 wt % of a colloidal silica abrasive; 0.001 to 5 wt % of an additive according to formula I, wherein the additive according to formula I is according to formula Ia:

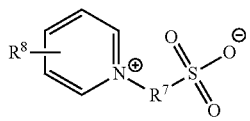

wherein $R^7$ is a $C_{1-8}$ alkyl group; wherein the chemical mechanical polishing composition contains <0.00000000001 wt % of an inclusion compound; and, wherein the chemical mechanical polishing composition contains <0.00000000001 wt % of an oxidizer.

The present invention provides a chemical mechanical polishing composition, comprising, as initial components: water, 0.1 to 40 wt % of a colloidal silica abrasive; 0.001 to 5 wt % of an additive according to formula I, wherein the additive according to formula I, is according to formula Ib

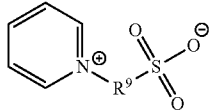

wherein $R^9$ is a $C_{1-8}$ alkyl group; wherein the chemical mechanical polishing composition contains <0.00000000001 wt % of an inclusion compound; and, wherein the chemical mechanical polishing composition contains <0.00000000001 wt % of an oxidizer.

The present invention provides a chemical mechanical polishing composition, comprising, as initial components: water, 0.1 to 40 wt % of a colloidal silica abrasive; 0.001 to 5 wt % of an additive according to formula I, wherein the additive according to formula I, is according to formula Ic

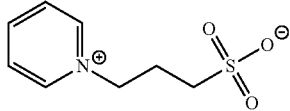

wherein the chemical mechanical polishing composition contains <0.00000000001 wt % of an inclusion compound; and, wherein the chemical mechanical polishing composition contains <0.00000000001 wt % of an oxidizer.

The present invention provides a method for chemical mechanical polishing of a substrate, comprising: providing a substrate, wherein the substrate comprises silicon oxide; providing a chemical mechanical polishing composition according to the present invention; providing a chemical mechanical polishing pad with a polishing surface; dispensing the chemical mechanical polishing composition onto the polishing surface of the chemical mechanical polishing pad at or near the interface between the chemical mechanical polishing pad and the substrate; and, creating dynamic contact at the interface between the chemical mechanical polishing pad and the substrate with a down force of 0.69 to 34.5 kPa; wherein the substrate is polished; wherein some of the silicon oxide is removed from the substrate.

The present invention provides a method for chemical mechanical polishing of a substrate, comprising: providing a substrate, wherein the substrate comprises silicon oxide; providing a chemical mechanical polishing composition according to the present invention; providing a chemical mechanical polishing pad with a polishing surface; dispensing the chemical mechanical polishing composition onto the polishing surface of the chemical mechanical polishing pad at or near the interface between the chemical mechanical polishing pad and the substrate; and, creating dynamic contact at the interface between the chemical mechanical polishing pad and the substrate with a down force of 0.69 to 34.5 kPa; wherein the substrate is polished; wherein some of the silicon oxide is removed from the substrate; wherein the chemical mechanical polishing composition exhibits a silicon oxide removal rate of ≥1,000 Å/min and wherein the chemical mechanical polishing composition facilitates a post polishing SP1 defect count having a size >0.16 µm of ≤70.

The present invention provides a method for chemical mechanical polishing of a substrate, comprising: providing a substrate, wherein the substrate comprises silicon oxide; providing a chemical mechanical polishing composition according to the present invention; providing a chemical mechanical polishing pad with a polishing surface; dispensing the chemical mechanical polishing composition onto the polishing surface of the chemical mechanical polishing pad at or near the interface between the chemical mechanical polishing pad and the substrate; and, creating dynamic contact at the interface between the chemical mechanical polishing pad and the substrate with a down force of 0.69 to 34.5 kPa; wherein the substrate is polished; wherein some of the silicon oxide is removed from the substrate; wherein the chemical mechanical polishing composition exhibits a silicon oxide removal rate of ≥1,000 Å/min and wherein the chemical mechanical polishing composition facilitates a post polishing SP1 scratch count having a size >0.16 µm of ≤25.

The present invention provides a method for chemical mechanical polishing of a substrate, comprising: providing a substrate, wherein the substrate comprises silicon oxide; providing a chemical mechanical polishing composition according to the present invention; providing a chemical mechanical polishing pad with a polishing surface; dispensing the chemical mechanical polishing composition onto the polishing surface of the chemical mechanical polishing pad at or near the interface between the chemical mechanical polishing pad and the substrate; and, creating dynamic contact at the interface between the chemical mechanical polishing pad and the substrate with a down force of 0.69 to 34.5 kPa; wherein the substrate is polished; wherein some of the silicon oxide is removed from the substrate; wherein the chemical mechanical polishing composition exhibits a silicon oxide removal rate of ≥1,000 Å/min; wherein the chemical mechanical polishing composition facilitates a post polishing SP1 defect count having a size >0.16 µm of ≤70; and, wherein the chemical mechanical polishing composition facilitates a post polishing SP1 scratch count having a size >0.16 µm of ≤25.

DETAILED DESCRIPTION

The chemical mechanical polishing composition of the present invention is designed for polishing a substrate comprising silicon oxide. The chemical mechanical polishing composition of the present invention contains, as an initial component, an additive according to formula I

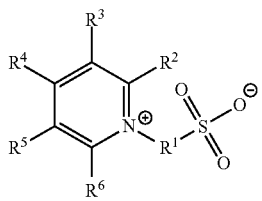

wherein $R^1$ is a $C_{1-8}$ alkyl group; wherein $R^2$, $R^3$, $R^4$, $R^5$, $R^6$ are each independently selected from a hydrogen, a halogen, a hydroxyl group and a $C_{1-8}$ alkyl group. The additive according to formula I stabilizes the colloidal silica abrasive in the chemical mechanical polishing composition from agglomerating over time, while having a minimal effect on the charge conductivity and zeta potential of the colloidal silica abrasive.

The term "substantially unchanged" used herein and in the appended claims regarding the change in removal rate (measured in Å/min) for silicon oxide resulting from the inclusion of the additive according to formula I in the chemical mechanical polishing composition means that the removal rate of silicon oxide changes by ≤10%. That is, the following expression will be satisfied when the silicon oxide removal rate is substantially unchanged:

((absolute value of $(B_0 - B))/B_0)*100 \leq 10$ wherein B is the silicon oxide removal rate in Å/min for a chemical mechanical polishing composition of the present invention containing, as an initial component, an additive according to formula I; $B_0$ is the silicon oxide removal rate obtained under identical conditions except that the additive according to formula I is absent from the chemical mechanical polishing composition.

The term "improved polishing defectivity performance" used herein and in the appended claims to describe the defectivity performance obtained through the inclusion of an additive according to formula I in the chemical mechanical polishing composition of the present invention means that the following expression is satisfied:

$X < X_0$ wherein X is the defectivity (i.e., post CMP/hydrogen fluoride scratches) for a chemical mechanical polishing composition containing, as an initial component, an additive according to formula I of the present invention, as measured under the polishing conditions set forth in the Examples; and $X_0$ is the defectivity (i.e., post CMP/hydrogen fluoride scratches) obtained under identical conditions except that the additive according to formula I is absent from the chemical mechanical polishing composition.

The water contained in the chemical mechanical polishing composition of the present invention is preferably at least one of deionized and distilled to limit incidental impurities.

The chemical mechanical polishing composition of the present invention comprises, as an initial component: 0.1 to 40 wt % (preferably, 5 to 25 wt %; more preferably, 10 to 20 wt %; most preferably, 14 to 17 wt %) of a colloidal silica abrasive. Preferably, the colloidal silica abrasive exhibits an average particle size of ≤200 nm (more preferably 10 to 200 nm; yet more preferably, 70 to 170 nm; most preferably 100 to 150 nm). Preferably, the colloidal silica abrasive exhibits a non-spherical, elongated morphology. Most preferably, the colloidal silica abrasive exhibits a hematite peanut shaped morphology.

The chemical mechanical polishing composition of the present invention preferably comprises, as an initial component: 0.001 to 5 wt % (preferably, 0.1 to 1 wt %; more preferably, 0.25 to 0.75 wt %; most preferably, 0.5 to 0.7 wt %) of an additive according to formula I:

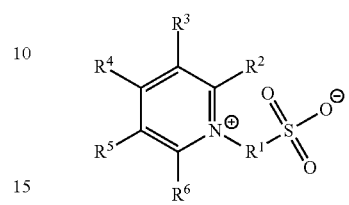

wherein $R^1$ is a $C_{1-8}$ alkyl group (preferably, a $C_{1-5}$ alkyl group; more preferably, a $C_{2-4}$ alkyl group; most preferably, a $C_3$ alkyl group); wherein $R^2$, $R^3$, $R^4$, $R^5$, $R^6$ are each independently selected from a hydrogen, a halogen, a hydroxyl and a $C_{1-8}$ alkyl group (preferably, a hydrogen, a hydroxyl group and a $C_{1-5}$ alkyl group; more preferably, a hydrogen and a $C_{1-5}$ alkyl group; most preferably, a hydrogen). Preferably, the chemical mechanical polishing composition of the present invention comprises, as an initial component: an additive according to formula I, wherein the additive according to formula I is according to formula Ia:

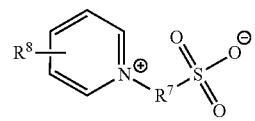

wherein $R^7$ is a $C_{1-8}$ alkyl group (preferably, a $C_{1-5}$ alkyl group; more preferably, a $C_{2-4}$ alkyl group; most preferably, a $C_3$ alkyl group); wherein $R^8$ is selected from a hydrogen, a halogen, a hydroxyl group and a $C_{1-8}$ alkyl group (preferably, a hydrogen, a hydroxyl group and a $C_{1-5}$ alkyl group; more preferably, a hydrogen and a $C_{1-5}$ alkyl group; most preferably, a hydrogen). More preferably, the chemical mechanical polishing composition of the present invention comprises, as an initial component: an additive according to formula I, wherein the additive according to formula I is according to formula Ib:

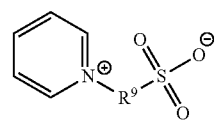

wherein $R^9$ is a $C_{1-8}$ alkyl group (preferably, a $C_{1-5}$ alkyl group; more preferably, a $C_{2-4}$ alkyl group; most preferably, a $C_3$ alkyl group). Most preferably, the chemical mechanical polishing composition of the present invention preferably comprises, as an initial component: an additive according to formula I, wherein the additive according to formula I is according to formula Ic:

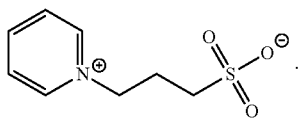

Ic

The chemical mechanical polishing composition of the present invention is preferably designed for polishing at a pH≤10 (more preferably, at a pH of 10 to 12; most preferably, at a pH of 10 to 11). The chemical mechanical polishing composition of the present invention can optionally include inorganic and organic pH adjusting agents. Preferably, the optional pH adjusting agent is selected from an inorganic acid or an inorganic base. Most preferably, the optional pH adjusting agent is selected from nitric acid, sulfuric acid, hydrochloric acid, phosphoric acid, potassium sulfate and potassium hydroxide.

The chemical mechanical polishing composition concentrate used in the chemical mechanical polishing method of the present invention optionally is preferably inclusion compound free. The term "inclusion compound" as used herein and in the appended claims means a compound that identifies other ions, atoms or molecules and traps them by various interactions in cavities formed within molecules or molecular aggregates (e.g., cyclodextrins, cyclophanes, neutral polyligands, cyclic polyanions, cyclic polycations, and cyclic peptides). The term "inclusion compound free" as used herein and in the appended claims means that the chemical mechanical polishing composition contains <0.00000000001 wt % (more preferably, <the detectable limit for) inclusion compounds.

The chemical mechanical polishing composition of the present invention is preferably oxidizer free. The term "oxidizer free" as used herein and in the appended claims means that the chemical mechanical polishing composition contains <0.00000000001 wt % (more preferably, <the detectable limit for) oxidizers, such as, hydrogen peroxide, nitrates, iodates, periodates, hypochlorites, chlorites, chlorates, perchlorates, persulfates, bichromates, permanganates, ozonated water, silver (II) salts, iron (III) salts, persulfate salts (e.g., ammonium monopersulfate, and potassium dipersulfate) and periodate salts (e.g., potassium periodate).

The chemical mechanical polishing composition of the present invention is preferably per-oxy oxidizer free. The term "per-oxy oxidizer" as used herein and in the appended claims means per-oxy oxidizers, such as, hydrogen peroxide, urea hydrogen peroxide, percarbonate salts, benzoyl peroxide, peracetic acid, sodium peroxide, di-tert-butyl peroxide, monopersulfate salts, dipersulfate salts, and iron(III) compounds. The term "per-oxy oxidizer free" as used herein and in the appended claims means that the chemical mechanical polishing composition contains <0.00000000001 wt % per-oxy oxidizer (more preferably, <the detectable limit for per-oxy oxidizers).

The chemical mechanical polishing method of the present invention preferably comprises: providing a substrate, wherein the substrate comprises silicon oxide; providing a chemical mechanical polishing composition of the present invention having a pH of ≥10 (more preferably, at a pH of 10 to 12; most preferably, at a pH of 10 to 11); providing a chemical mechanical polishing pad with a polishing surface (preferably, wherein the chemical mechanical polishing pad comprises a polyurethane polishing layer containing polymeric hollow core microparticles and a polyurethane impregnated non-woven subpad); dispensing the chemical mechanical polishing composition onto the polishing surface; moving the polishing surface relative to the substrate, wherein at least some of the silicon oxide is removed from the substrate to polish the substrate.

The substrate polished in the chemical mechanical polishing method of the present invention comprises silicon oxide. The silicon oxide in the substrate can be any suitable silicon oxide material known in the art; for example, borophosphosilicate glass (BPSG), plasma-etched tetraethyl ortho silicate (PETEOS), thermal oxide, undoped silicate glass, high density plasma (HDP) oxide.

The chemical mechanical polishing pad used in the chemical mechanical polishing method of the present invention can by any suitable polishing pad known in the art. The chemical mechanical polishing pad may preferably be selected from woven and non-woven polishing pads. The chemical mechanical polishing pad can be made of any suitable polymer of varying density, hardness, thickness, compressibility and modulus. The chemical mechanical polishing pad can be grooved and perforated as desired.

Preferably, in the chemical mechanical polishing method of the present invention, the chemical mechanical polishing composition is dispensed onto the polishing surface of the chemical mechanical polishing pad at or near the interface between the chemical mechanical polishing pad and the substrate.

Preferably, in the chemical mechanical polishing method of the present invention, comprises: creating dynamic contact at the interface between the chemical mechanical polishing pad and the substrate with a down force of 0.69 to 34.5 kPa; wherein the chemical mechanical polishing composition exhibits a silicon oxide removal rate of ≥1,000 Å/min (preferably, ≥1,500 Å/min; more preferably, ≥2,000 Å/min; most preferably, ≥2,500 Å/min) and wherein the chemical mechanical polishing composition facilitates a post polishing SP1 defect count having a size >0.16 µm of ≤70 (preferably, ≤60; more preferably ≤50) (determined according to the method described herein in the Examples).

Preferably, in the chemical mechanical polishing method of the present invention, comprises: creating dynamic contact at the interface between the chemical mechanical polishing pad and the substrate with a down force of 0.69 to 34.5 kPa; wherein the chemical mechanical polishing composition exhibits a silicon oxide removal rate of ≥1,000 Å/min (preferably, ≥1,500 Å/min; more preferably, ≥2,000 Å/min; most preferably, ≥2,500 Å/min) and wherein the chemical mechanical polishing composition facilitates a post polishing SP1 scratch count having a size >0.16 µm of ≤25 (preferably, ≤20; more preferably ≤15) (determined according to the method described herein in the Examples).

The additive according to formula I (more preferably, according to formula Ia; more preferably, according to formula Ib; most preferably according to formula Ic) contained in the chemical mechanical polishing composition used in the chemical mechanical polishing method of the present invention preferably has substantially no effect on the removal rate of silicon oxide (as measured in angstroms per minute, Å/min). That is, the silicon oxide removal rate is "substantially unchanged" by the inclusion of the additive according to formula I in the chemical mechanical polishing composition of the present invention The additive according to formula I (more preferably, according to formula Ia; more preferably, according to formula Ib; most preferably according to formula Ic) contained in the chemical mechanical polishing composition used in the chemical mechanical polishing method of the present invention results in an improved polishing defectivity performance. Preferably, the inclusion of the additive according to formula I (more preferably, according to formula Ia; more preferably, according to formula Ib; most preferably according to formula Ic) in the chemical mechanical polishing composition, as an initial component, provides a ≥25%; more preferably ≥30%; most preferably ≥40% reduction in polishing defectivity (i.e., post CMP/hydrogen fluoride scratches), as measured under the polishing conditions set forth in the Examples. That is, at least one of the following equations is preferably satisfied:

$$(X_0-X)/X*100 \geq 25; \quad (i)$$

$$(X_0-X)/X*100 \geq 30; \text{ and,} \quad (ii)$$

$$(X_0-X)/X*100 \geq 40; \quad (iii)$$

wherein X is the polishing defectivity (i.e., post CMP/hydrogen fluoride scratches) for a chemical mechanical polishing composition containing an additive according to formula I, as measured under the polishing conditions set forth in the Examples; and $X_0$ is the polishing defectivity (i.e., post CMP/hydrogen fluoride scratches) obtained under identical conditions except that the additive according to formula I is absent from the chemical mechanical polishing composition.

Some embodiments of the present invention will now be described in detail in the following Examples.

Comparative Examples C1-C2 and Example 1

The chemical mechanical polishing compositions of Comparative Examples C1-C2 and Example 1 were prepared by combining the components in the amounts listed in TABLE 1 with the balance being deionized water and adjusting the pH of the compositions to the final pH listed in TABLE 1 with potassium hydroxide.

TABLE 1

| Ex # | Abrasive* (wt %) | Abrasive£ (wt %) | additive formula I (wt %)€ | BTMAC℞ (wt %) | pH |
|---|---|---|---|---|---|
| C1 | 16 | — | — | — | 10.8 |
| C2 | — | 16 | — | 0.4 | 10.8 |
| 1 | 16 | — | 0.65 | — | 10.8 |

*Abrasive I--Klebosol ™ 1630 slurry manufactured by AZ Electronic Materials, available from The Dow Chemical Company.
£Abrasive II--Klebosol ™ 1730 slurry manufactured by AZ Electronic Materials, available from The Dow Chemical Company.
€ 3-(1-pyridinio)-1-propanesulfonate (PPS) available from Aldrich (CAS Number 15471-17-7).
℞ benzyltrimethyl ammonium chloride (BTMAC) available from Aldrich.

Comparative Examples PC1-PC2 and Example P1

Chemical Mechanical Polishing Removal Rate Experiments

Silicon dioxide removal rate polishing tests were performed using the chemical mechanical polishing compositions prepared according to Comparative Examples PC1-PC2 and Example 1 in Comparative Examples PC1-PC2 and Example P1, respectively. Specifically, the silicon dioxide removal rate for each of the chemical mechanical polishing compositions as identified in TABLE 1. The polishing removal rate experiments were performed on 200 mm blanket 1 k TEOS sheet wafers from SEMATECH SVTC. An Applied Materials 200 mm Mirra® polisher was used. All polishing experiments were performed using an IC 1010™ polyurethane polishing pad (commercially available from Rohm and Haas Electronic Materials CMP Inc.) with a down force of 20.7 kPa (3 psi), a chemical mechanical polishing slurry composition flow rate of 200 ml/min, a table rotation speed of 93 rpm and a carrier rotation speed of 87 rpm. A Diagrid® AD3BG-150855 diamond pad conditioner (commercially available from Kinik Company) was used to condition the polishing pad. The polishing pad was broken in with the conditioner using a down force of 14.0 lbs (6.35 kg) for 20 minutes. The polishing pad was further conditioned ex situ prior to polishing using a down force of 9 lbs (4.1 kg) for 10 minutes. The polishing pad was further conditioned in situ during polishing at 10 sweeps/min from 1.7 to 9.2 in from the center of the polishing pad with a down force of 9 lbs (4.1 kg). The removal rates were determined by measuring the film thickness before and after polishing using a KLA-Tencor FX200 metrology tool using a 49 point spiral scan with a 3 mm edge exclusion. The results of the removal rate experiments are provided in TABLE 2

TABLE 2

| Ex # | Chemical mechanical polishing composition | TEOS removal rate (Å/min) |
|---|---|---|
| PC1 | Comp. Ex. C1 | 2654 |
| PC2 | Comp. Ex. C2 | 2796 |
| P1 | Ex. 1 | 2627 |

The defectivity performance of the chemical mechanical polishing compositions reported in TABLE 3 was determined using a Scanning Electron Microscope either after polishing and a hydrogen fluoride post polishing wash ("Pst-HF"). All the TEOS wafers after Pst-HF wash were inspected using a Surfscan® SP1 defect inspection system available from KLA-Tencor. The defects information, including their coordinates on the wafer, was recorded in KLARF (KLA Results File) which was then transferred to eDR-5200 defect review system available from KLA-Tencor. A random sample of 100 defect images were selected and reviewed by eDR-5200 system. These 100 images were classified into various defect types, for example, chatter marks (scratches), particles and pad debris. Based on classification results from these 100 images, the total number of scratches on the wafer was determined.

TABLE 3

| Chemical mechanical polishing composition | Pst-HF defects | Pst-HF scratches |
|---|---|---|
| Comp. Ex. C1 | 71 | 26 |
| Comp. Ex. C2 | 36 | 13 |
| Ex. 1 | 49 | 11 |

I claim:

1. A method for chemical mechanical polishing of a substrate, comprising:

providing a substrate, wherein the substrate comprises silicon oxide;

providing a chemical mechanical polishing composition, comprising, as initial components:

water, 0.1 to 40 wt % of a colloidal silica abrasive;

0.001 to 5 wt % of an additive according to formula I:

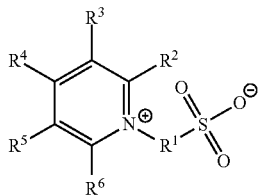

wherein $R^1$ is a $C_{1-8}$ alkyl group; wherein $R^2$, $R^3$, $R^4$, $R^5$, $R^6$ are each independently selected from a hydrogen, a halogen, a hydroxyl group and a $C_{1-8}$ alkyl group; wherein the chemical mechanical polishing composition contains <0.00000000001 wt % of an inclusion compound; and, wherein the chemical mechanical polishing composition contains <0.00000000001 wt % of an oxidizer;

providing a chemical mechanical polishing pad with a polishing surface;

dispensing the chemical mechanical polishing composition onto the polishing surface of the chemical mechanical polishing pad at or near the interface between the chemical mechanical polishing pad and the substrate; and, creating dynamic contact at the interface between the chemical mechanical polishing pad and the substrate with a down force of 0.69 to 34.5 kPa;

wherein the substrate is polished; wherein some of the silicon oxide is removed from the substrate.

2. The method of claim 1, wherein the chemical mechanical polishing composition provided exhibits a pH of ≥10.

3. The method of claim 1, wherein the chemical mechanical polishing composition provided exhibits a TEOS removal rate of ≥1,000 Å/min with a platen speed of 93 revolutions per minute, a carrier speed of 87 revolutions per minute, a chemical mechanical polishing composition flow rate of 200 ml/min, a nominal down force of 20.68 kPa on a 300 mm polishing machine; and, wherein the chemical mechanical polishing pad is a polyurethane impregnated non-woven pad.

4. The method of claim 1, wherein the additive according to formula I, is according to formula Ia

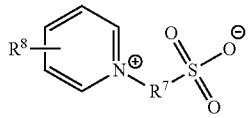

wherein $R^7$ is a $C_{1-8}$ alkyl group and wherein $R^8$ is selected from a hydrogen, a halogen, a hydroxyl group and a $C_{1-8}$ alkyl group.

5. The method of claim 1, wherein the additive according to formula I, is according to formula Ib

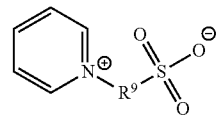

wherein $R^9$ is a $C_{1-8}$ alkyl group.

6. The method of claim 1, wherein the additive according to formula I, is according to formula Ic

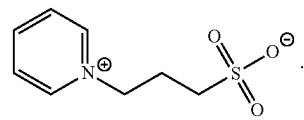

7. The method of claim 1, wherein the chemical mechanical polishing composition exhibits a silicon oxide removal rate of ≥1,000 Å/min and wherein the chemical mechanical polishing composition facilitates a post polishing SP1 defect count having a size >0.16 μm of ≤70.

8. The method of claim 1, wherein the chemical mechanical polishing composition exhibits a silicon oxide removal rate of ≥1,000 Å/min and wherein the chemical mechanical polishing composition facilitates a post polishing SP1 scratch count having a size >0.16 μm of ≤25.

9. The method of claim 1, wherein the chemical mechanical polishing composition exhibits a silicon oxide removal rate of ≥1,000 Å/min; wherein the chemical mechanical polishing composition facilitates a post polishing SP1 defect count having a size >0.16 μm of ≤70; and, wherein the chemical mechanical polishing composition facilitates a post polishing SP1 scratch count having a size >0.16 μm of ≤25.

* * * * *